United States Patent [19]

Stephens, Jr.

[11] Patent Number: 5,517,137
[45] Date of Patent: May 14, 1996

[54] SYNCHRONOUS SELF-TIMED CLOCK PULSE CIRCUIT HAVING IMPROVED POWER-UP PERFORMANCE

[75] Inventor: Michael C. Stephens, Jr., San Jose, Calif.

[73] Assignee: Alliance Semiconductor Corporation, San Jose, Calif.

[21] Appl. No.: 445,176

[22] Filed: May 19, 1995

[51] Int. Cl.$^6$ .................................................. H03K 19/00
[52] U.S. Cl. ............................ 326/93; 327/172; 327/198; 327/292; 327/295
[58] Field of Search ...................... 326/93; 327/172–173, 327/175, 198, 291–292, 295

[56] References Cited

U.S. PATENT DOCUMENTS

| | | | |
|---|---|---|---|
| 5,265,064 | 11/1993 | Davies | 326/95 |
| 5,289,050 | 2/1994 | Ogasawara | 326/93 |
| 5,355,090 | 10/1994 | Pajowski et al. | 327/292 |

Primary Examiner—Edward P. Westin
Assistant Examiner—Jon Santamauro
Attorney, Agent, or Firm—Bradley T. Sako

[57] ABSTRACT

A self-timed synchronous clock pulse circuit (100) is disclosed that includes a pulse pull-down circuit (102) pulling a first pulse node (104) to ground upon receiving the rising edge of an external clock. A pulse generator (108) responsive to a high-to-low transition at the first pulse node (104) generates a second clock pulse. A pulse pull-up circuit (110) is responsive to the second edge of the second clock pulse and pulls the first pulse node (104) to the positive power supply. An initialization circuit (112) is provided to prevent a lock-up condition upon power-up by sampling the logic level of the first pulse node (104) on the rising edge of the external clock. The logic value is essentially held throughout the remainder of the clock cycle by gating the value into a second latch during the second portion of an external clock cycle. The sampled logic value is used to correct the lock-up condition by gating the logic level of the second latch (124) into a third latch (128) during a first portion of the external clock cycle, the output of the third latch (128) being coupled to an initialization pull-up circuit (114) which pulls the first pulse node (104) high such that within two clock cycles the power-up lock-up state is eliminated.

13 Claims, 3 Drawing Sheets

SYNCHRONOUS SELF-TIMED CLOCK PULSE CIRCUIT HAVING IMPROVED POWER-UP PERFORMANCE

TECHNICAL FIELD

The present invention relates generally to synchronous clock circuits for generating an internal clock synchronous with an external clock, and more particularly to self-timed synchronous clock pulse circuits.

BACKGROUND OF THE INVENTION

To facilitate the operation between various integrated circuits within a system it is common to use synchronous devices which operate synchronously with a system clock. Synchronous devices commonly receive the system clock signal and generate an internal synchronous clock signal from which to time the various functions of the device.

A synchronous circuit is referred to as "self-timed" when its various internal operations follow from an initial system clock edge. To accomplish self-timing it is known in the prior art to generate one or more internal clock pulses from a system clock edge. The internal clock pulses are distributed within the circuit to trigger internal operations. It is particularly advantageous to generate a second clock pulse "within" a first clock pulse; i.e. the first edge of the first clock pulse precedes the first edge of the second clock pulse, while the second edge of the first clock pulse follows the second edge of the second clock pulse. The arrangement of closely-spaced, subsequent clock pulses is useful for closely timed circuit functions.

A prior art self-timed clock pulse circuit is illustrated in FIG. 1 and designated by the general reference character 10. The prior art clock pulse circuit includes a clock edge detector 12, a pull-up circuit 14, a signal delay 16, a pulse edge detector 18, and a pull-down circuit 20. The clock edge detector 12 receives an external clock signal and activates the pull-up circuit 14 when it detects a rising external clock edge. When activated, the pull-up circuit 14 temporarily pulls a clock node 22 to a positive power supply 24. Assuming the clock node 22 was previously at a low logic level, the clock node 22 undergoes a low-to-high transition. This transition functions as the first edge of an internal clock pulse (CLP). The logic transition at clock node 22 is delayed by the signal delay 16 and then applied to the pulse edge detector 18. The pulse edge detector 18, in a similar fashion to the clock edge detector 12, activates the pull-down circuit 20 when it detects a rising clock pulse edge. The pull-down circuit 20, like the pull-up circuit 14, temporarily pulls the clock node 22 to ground 26. This high-to-low transition creates the second clock pulse edge. The clock pulse circuit 10 is then ready to detect the next rising edge of the external clock signal.

A drawback to prior art self-timed clock pulse circuits is the susceptibility of such circuits to a lock-up condition upon power-up. For example, the discussion of the circuit of FIG. 1 assumed that the clock node 22 was low prior to the arrival of the first rising external clock edge. For example, if node 22 was high on power-up, no pulse edge would be generated by the arrival of a rising external clock edge, and clock node 22 would remain high. The clock circuit would be "locked-up" in this state.

It is known in the prior art to overcome the uncertainty of logic states upon power-up by relying upon a circuit which detects the ramp-up of the power supply and generates a particular logic state therefrom. Such circuits can be unreliable, however, by failing in instances where the ramp-up is non-ideal (i.e. too gradual or too fast). Additionally, such circuits can require relatively large circuit components, such as large coupling capacitors.

Accordingly, it would be desirable to provide a self-timed synchronous clock pulse circuit that is immune to a lock-up condition upon power-up without relying upon power supply ramp-up detection circuits.

SUMMARY OF THE INVENTION

It is an object of the present invention to provide a synchronous self-timed clock pulse circuit that prevents a "lock-up" condition upon power up.

According to a preferred embodiment of the present invention, a self-timed synchronous clock pulse circuit that is immune to lock-up upon power-up generates a first synchronous clock pulse and a second synchronous clock pulse within the first clock pulse. The clock pulse circuit includes a pulse pull-down circuit for temporarily pulling a pulse node to a logic low level upon detection of a rising external clock edge. The logic value at the first pulse node is latched by a first latch. If the first pulse node is initially at a logic high level, a high-to-low going edge is generated which serves as the first edge of a first clock pulse. A pulse generating circuit is coupled to the first pulse node and generates a second clock pulse in response to the first edge of the first clock pulse. The second clock pulse includes a first edge and a second edge. A pulse pull-up circuit is coupled to the pulse generating circuit and temporarily pulls the first clock node to a logic high level in response to the second edge of the second clock pulse. This creates a low-to-high going edge at the first pulse node which serves as the second edge of the first clock pulse.

A low logic level at the first pulse node upon power-up would create a lock-up condition by preventing an initial high-to-low transition at the first pulse node. Lock-up is prevented by an initialization circuit that includes a second latch coupled to the first pulse node by a first clocked gate and a third latch coupled to the second latch by a second clocked gate. The third latch is coupled to a pull-up circuit. The first clocked gate is open during the second portion of the external clock duty cycle (between the falling edge and the rising edge. Conversely, the second clocked gate is open during the first portion of the external clock duty cycle (between the rising edge and the falling edge). The logic of the initialization circuit is such that if a low logic level is clocked from the first pulse node through to the third latch, the resulting logic level of the third latch will provide a pull-up signal to the pull-up circuit. The pull-up circuit receives inputs from the third latch and the external clock signal and is designed to pull the first pulse node to the positive power supply upon receipt of a pull-up signal from the third latch during the second portion of the external clock duty cycle. Once the first pulse node is pulled high, removing the lock-up condition, the high logic at the first pulse node is clocked through to the third latch which disables the pull-up circuit.

An advantage of the present invention is that it provides a synchronous self-timed clock pulse circuit that prevents a lock-up upon power-up and allows for an adjustable clock pulse duration greater than or less than the first or second portions of the external clock duty cycle from which it is timed.

Other objects and advantages of the invention will become apparent in light of the following description thereof.

DETAILED DESCRIPTION OF THE EMBODIMENTS

Figure 1:
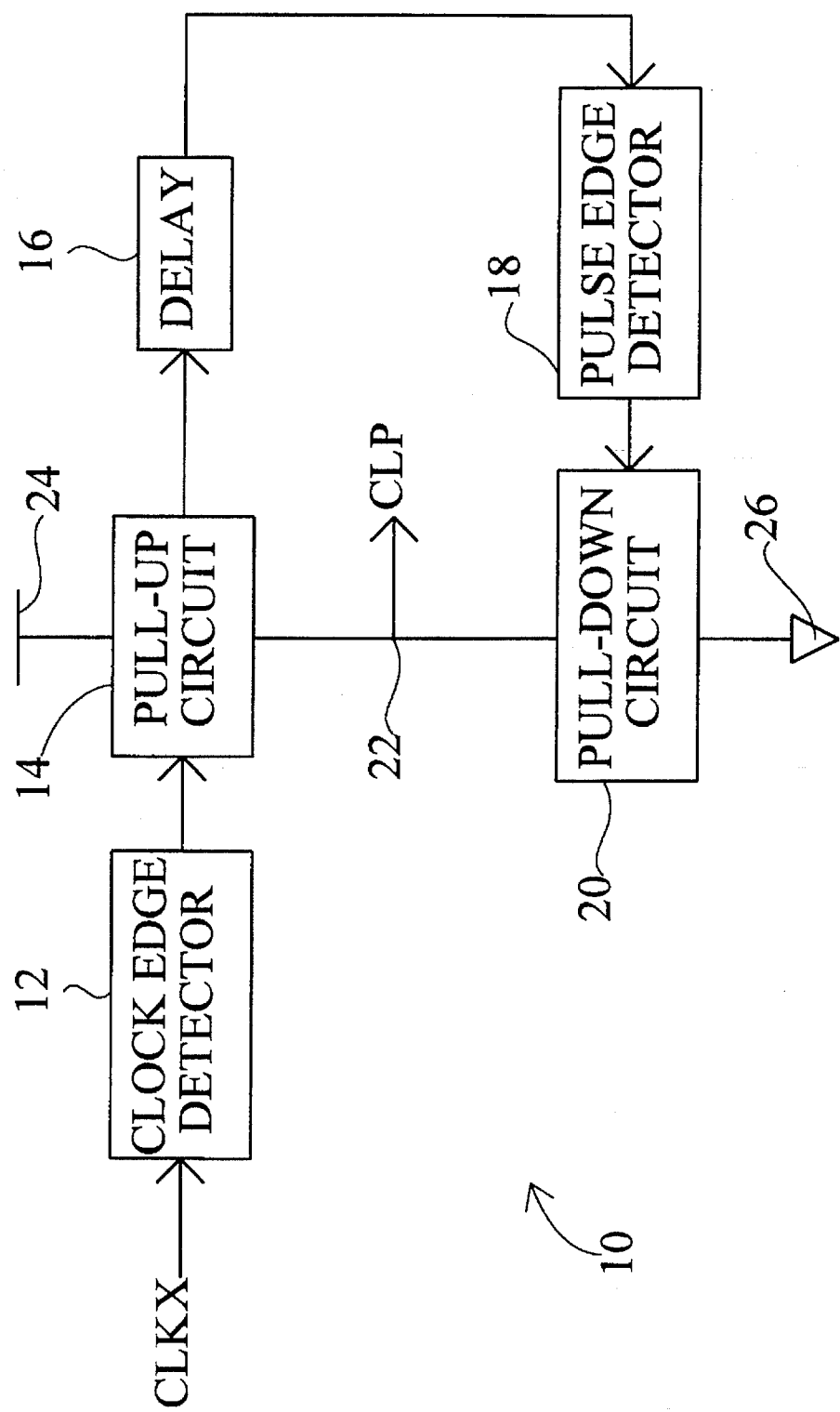
FIG. 1 is a block schematic diagram illustrating a prior art self-timed synchronous clock pulse circuit.
Figure 2:
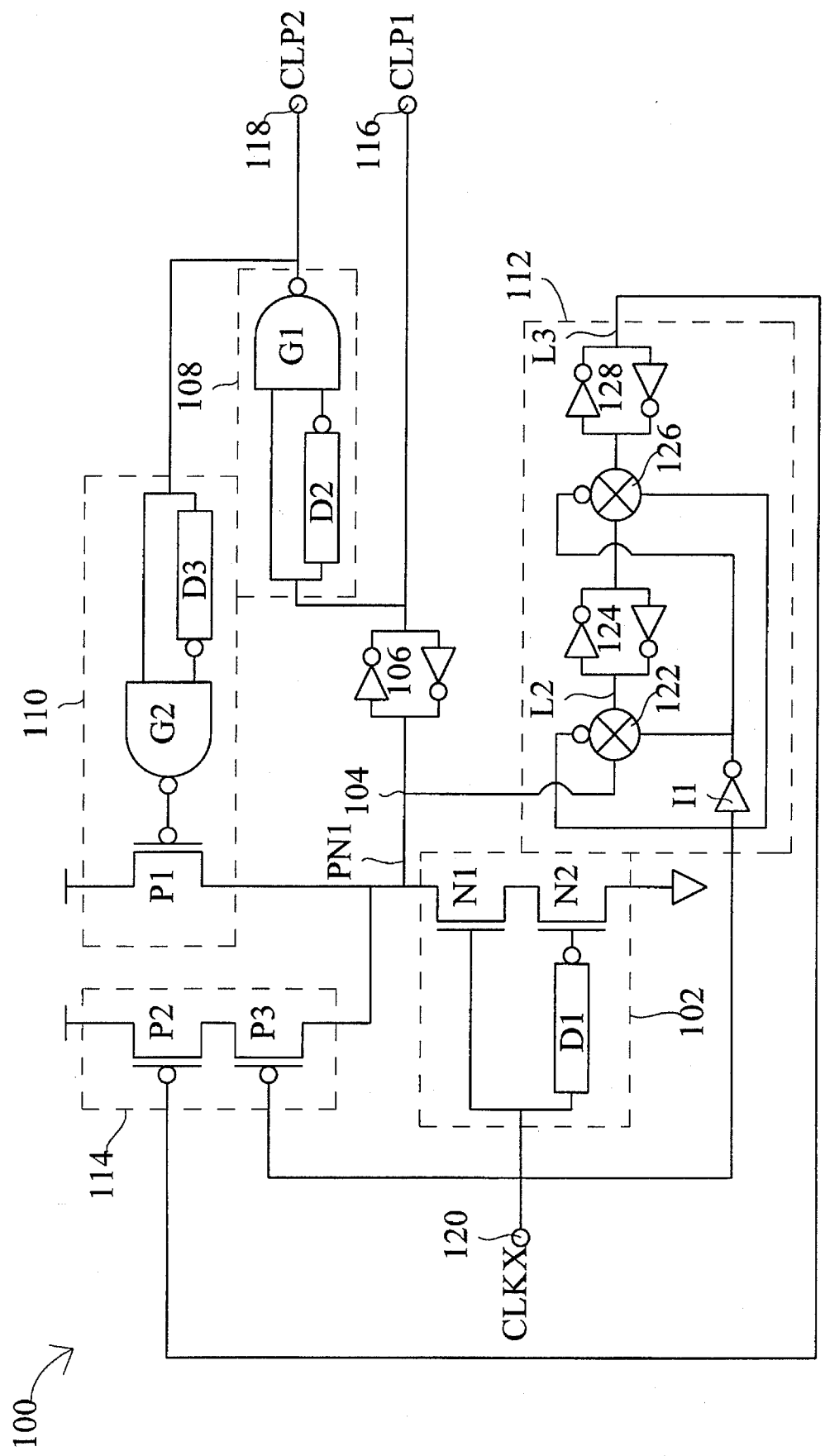
FIG. 2 is a schematic diagram illustrating a preferred embodiment of the present invention.

FIG. 2 illustrates, generally, a schematic diagram of a self-timed synchronous clock pulse circuit according to a preferred embodiment of the present invention. The clock pulse circuit is designated by the general reference character 100 and can be conceptualized as including a pulse pull-down circuit 102, a first pulse node 104 with a first latch 106, a pulse generator 108, a pulse pull-up circuit 110, an initialization circuit 112, and an initialization pull-up circuit 114. A first clock pulse (CLP1) is provided at a first clock pulse output 116. Similarly, a second clock pulse (CLP2) is provided at a second clock pulse output 118. An external clock signal (CLKX) is received at an external clock input 120. In the preferred embodiment, the CLKX signal is buffered by a clock buffer circuit (not shown).

The pulse pull-down circuit 102 includes a first n-channel MOS transistor (N1), a second n-channel MOS transistor (N2) and an inverting delay element (D1). One skilled in the art would recognize that an inverting delay element inverts and delays an input signal for a delay period. It is noted that the inverting delay element could include a plurality of inverters and/or resistance-capacitance (RC) elements. In addition, such delay elements can include adjustable delays whereby programmable elements or fusible elements are used to disable or enable inverters or RC elements to increase or decrease the duration of the delay.

Referring once again to FIG. 2, it is shown that N1 is connected by its drain to the first pulse node 104 and by its source to the drain of N2. The source of N2 is connected to ground. CLKX is applied to the gate of N1 and to the gate of N2 by way of D1. Accordingly, on the first (low-to-high) CLKX edge N1 and N2 will be turned on, pulling the first pulse node 104 to ground for the delay period D1. On the second (high-to-low) clock edge of CLKX, N1 is turned off and N2 remains off.

The first pulse node 104 is latched by the first latch 106. In the preferred embodiment, the latch is composed of cross coupled inverters and receives the first pulse node 104 at its input and provides the first clock pulse output 116 as its output. In this manner CLP1 is the inverse of the logic at the first pulse node 104.

The output of the first latch 106 is applied to the pulse generator 108. The pulse generator 108 generates a second clock pulse (CLP2) in response to the first edge of CLP1. In the preferred embodiment, CLP2 is a low-going pulse generated by a low-to-high transition at the input of the pulse generator 108. The pulse generator 108 of the preferred embodiment is formed from a two-input NAND gate (G1) and an inverting delay element (D2). The first latch 106 output is coupled directly to the one input of G1, and to the other input of G1 via D2. Accordingly, the duration of CLP2 generated at the second clock pulse output 118 is determined by the delay of D2. In the preferred embodiment, D2 is adjustable allowing for variability in the duration of CLP2, and consequently, as will be illustrated at a later point herein, the duration of CLP1.

The output of the pulse generator 108 (CLP2) is applied to the pulse pull-up circuit 110. The pulse pull-up circuit is responsive to the second edge of the second clock pulse (in the embodiment of FIG. 2, a low-to-high transition) and temporarily pulls the first pulse node 104 to the positive power supply. In the preferred embodiment, the pulse pull-up circuit 110 includes a two input NAND gate (G2), an inverting delay element (D3) and a p-channel MOS transistor P1. CLP2 is applied directly to one input of G2 and to the other input via D3. Accordingly, in a similar fashion to the pulse generator 108, upon receiving a low-to-high transition, a low-going pull-up pulse is generated at the output of G2. The duration of the pull-up pulse is determined by the delay of D3. Upon receiving the pull-up pulse, P1 turns on for the duration of the pull-up pulse and pulls the first pulse node 104 to the positive power supply.

The initialization circuit 112 of the present invention samples the logic state at the first pulse node 104 on the triggering (low-to-high) edge of CLKX. This value, in effect, is held throughout the remainder of the CLKX cycle for a total hold time of one CLKX cycle. If, at the end of the hold time, the sampled logic indicates a lock-up condition of the first pulse node 104, a circuit (in the preferred embodiment the initialization pull-up circuit 114) is used to bring the first pulse node 104 out of the lock-up condition. On the other hand, if the sampled logic indicates "normal" operation (i.e. no lock-up), normal operation continues. The initialization circuit 112 of the preferred embodiment is shown to include a first clocked gate 122, a second latch 124, a second clocked gate 126, and a third latch 128. The first clocked gate 122 is situated between the first pulse node 104 and the second latch 124. The second clocked gate 126 is situated between the second latch 124 and the third latch 128. The first clocked gate 122 and second latch 124 operate together to latch the logic level of the first pulse node 104 during the second portion of the CLKX duty cycle (when CLKX is low, in the embodiment of FIG. 2). Conversely, the second clocked gate 126 and the third latch 128 operate together to latch the logic value of the second latch 124 during the first portion of the CLKX duty cycle. In the preferred embodiment, the first and second clocked gates (122 and 126) are passgates composed of coupled n-channel and p-channel MOS transistors. The second and third latches (124 and 128) are formed from cross-coupled inverters. In addition, the initialization circuit includes an inverter I1 for receiving CLKX and generating an inverted CLKX. As illustrated in FIG. 2, CLKX is applied directly to the p-channel device of the first passgate 122 and to the n-channel device of the second passgate 126. Similarly, the inverted CLKX signal is applied to the n-channel device of the first passgate 122 and to the p-channel device of the second passgate 126. The output of the initialization circuit 112 is provided by the output of the third latch 128.

The initialization pull-up circuit 114 receives the output of the initialization circuit 112 and CLKX, and in response pulls the first pulse node 104 to the positive power supply if the initialization circuit 112 output (the previously sampled logic value of pulse node 104) indicates the lock-up condition. This pull-up operation is realized in the preferred embodiment by the output of the initialization circuit 112 indicating pull-up operation during the second portion of the CLKX duty cycle. Pull-up operation will be set forth in more detail at a later point herein. In the preferred embodiment, the initialization pull-up circuit 114 is composed of p-channel MOS transistors P2 and P3. P2 is connected by its source to the positive power supply and by its drain to the source of P3. P3 is connected by its drain to the first pulse node 104.

The initialization circuit 112 indicates pull-up operation when the output of the third latch 128 is low. When the output of the third latch 128 is low, P2 is turned on. If CLKX is low (in the second portion of the duty cycle) P3 is also on, and the first pulse node 104 is pulled to the positive power supply.

Figure 3:
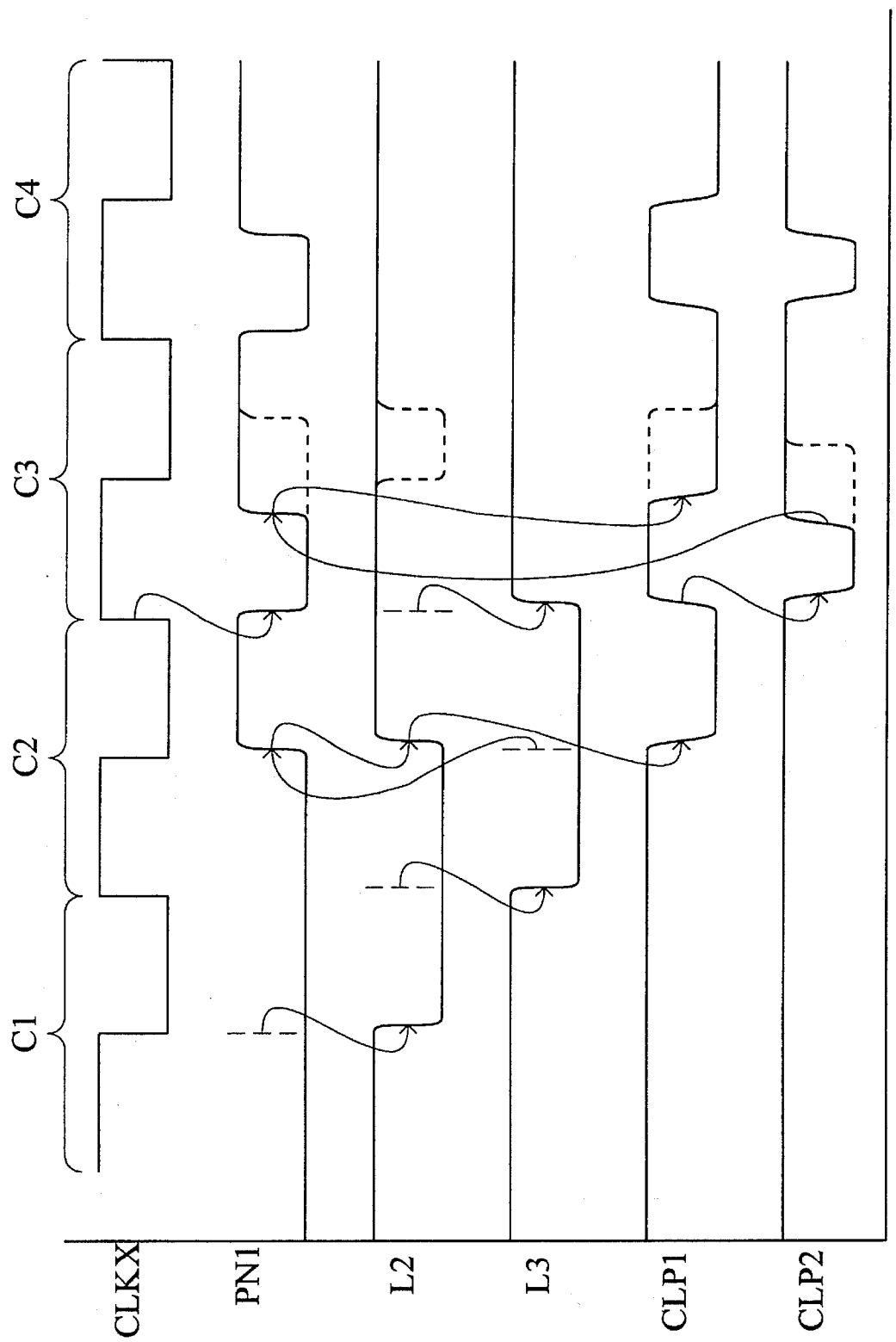
FIG. 3 is a timing diagram illustrating the operation of the preferred embodiment set forth in FIG. 2.

Having described a preferred embodiment of the present invention, the operation of the clock circuit 100 will now be discussed. The operation of the clock circuit is best understood by referring to FIG. 2 in conjunction with the timing diagram of FIG. 3. FIG. 3 illustrates the signals at various nodes within the clock circuit 100. Referring now to FIG. 3 in conjunction with FIG. 2, it is shown that signal "PN1" illustrates the signal at the first pulse node 104, signal "L2" illustrates the signal at the input of the second latch 124, and the signal "L3" illustrates the signal at the output of the third latch 128. The signals CLKX, CLP1 and CLP2 were previously described above. In FIG. 3, CLKX is shown as consecutive clock cycles C1–C4, each having a first (high) portion and a second (low) portion. It is understood that while the CLKX signal in FIG. 3 appears to have a fifty percent (50%) duty cycle, this is intended to be illustrative only. The present invention works equally as well with CLKX signals having unequal duty cycles.

Referring now to FIG. 2 and FIG. 3, it is shown that FIG. 3 illustrates a case where the power-up logic levels of the clock pulse circuit 100 create a lock-up condition, consequently CLP1 is high. With PN1 low, it is not possible to generate the high-to-low transition necessary to trigger the pulse generator 108. In addition, in the case illustrated in FIG. 3, L2 and L3 have powered up in the logic high state.

During the first portion of C1, the first clocked gate 122 is closed and the second clocked gate 126 is open. Because the logic values at the output of the second latch 124 and the input of the third latch 128 are the same, no change in logic value occurs.

During the second portion of C1, the first clocked gate 122 is open, and the low logic state of PN1 is clocked through to the second latch 124 resulting in L2 going low. The second clocked gate 126 is closed and L3 remains high.

During the first portion of C2, the logic value stored in the second latch 124 is clocked through to the third latch 128 resulting in L3 going low. At this point the lock-up logic state present at PN1 on power-up has been clocked all the way through the initialization circuit 112, indicating pull-up operation. In the preferred embodiment, this is realized by the logic low at L3 turning on P2. Although P2 is turned on, P3 remains turned off because CLKX is high.

During the second portion of C2 the low CLKX signal turns on P3 and, with both P2 and P3 turned on, PN1 is pulled to the positive power supply. The first latch 106 latches this logic state resulting in CLP1 going low. Because the first clocked gate 122 is on during this half cycle the logic value at PN1 is latched in the second latch 124. Consequently, L2 is driven high. At this point, the clock pulse circuit 100 is "initialized." That is, the lock-up condition has been removed and the clock pulse circuit 100 is ready to generate synchronous self-timed clock pulses.

Upon the rising edge of CLKX at the start of external clock cycle C3, the low-to-high transition of CLKX activates the pulse pull-down circuit 102. At the same time, the high CLKX at the gate of P3, turns off P3. The logic state of the second latch 124 is clocked through to the third latch 128 and L3 is pulled high. The operation of the pulse pull-down circuit 102 pulls PN1 to ground for a period determined by D1 creating a high-to-low transition at PN1.

The logic value of PN1 is latched by the first latch 106 and it creates the first (low-to-high) edge of CLP1.

As previously described, the low-to-high edge of CLP1 activates the pulse generator 108 which generates the low-going CLP2 pulse. At the end of the CLP2 pulse the low-to-high edge is applied to the pulse pull-up circuit 110 which pulls PN1 to the positive power supply for a time period determined by D3. This creates a low-to-high transition at PN1 that is latched by the first latch 106 and creates the second (high-to-low) edge of CLP1.

External clock cycle C4 illustrates the "normal" operation of the clock pulse circuit 100. PN1 is high prior to the rising edge of the CLKX and so is responsive to the first edge of the external clock. In addition, the logic at L2 and L3 keep P2 turned off.

It is noted that the duration of the CLP1 pulse (determined by D2) can be adjusted to extend beyond, or be shorter than, the first portion of the CLKX cycle without adverse effect on the operation of the clock pulse circuit 100. Such a case is illustrated by the dashed portions of the PN1, L2, CLP1 and CLP2 waveforms. In the event PN1 remains low throughout the first portion of a CLKX cycle and into the second portion, the low logic state at PN1 will be latched into the second latch 124. However, because the first clocked gate remains open during the entire second portion of the CLKX cycle, once PN1 is pulled high again, L2 follows and goes high, and the clock pulse circuit 100 maintains normal operation.

One skilled in the art would recognize that regardless of the power-up state of PN1, L2 and/or L3, the clock pulse circuit 100 will settle into the normal operation within two external clock cycles.

While the foregoing embodiment illustrates a clock pulse circuit 100 having particular circuit elements of a particular type, this should not be considered limiting. As just a few examples, different types of latches can be employed instead of the cross coupled inverters set forth above. Alternate pulse generating configurations could be used. For example the pulse pull-up circuit could be similar to the pulse pull-down circuit, employing two p-channel devices and a delay element. Further, the pulse polarity configurations should not be considered limiting. An embodiment could be triggered to provide a pull-up signal in response to an external clock edge. Accordingly, the clock pulse circuit can be conceptualized as having a first pull-up/down circuit connected to a first logic level and a second pull-up/down circuit connected to the opposite logic level. The number of internal clock pulses generated could also be varied. The present invention could include only a delay element instead of the pulse generator and generate only one clock pulse. Alternatively, multiple pulse generators could be triggered by an initial CLKX edge for the generation of multiple clock pulses having varying phase relationships.

As will be apparent to one skilled in the art, the invention has been described in connection with its preferred embodiments, and may be changed, and other embodiments derived, without departing from the spirit and scope of the invention.

What I claim is:

1. A self-timed synchronous clock circuit for generating a clock pulse from an external clock, the external clock having a first clock edge and first portion, and a second clock edge and a second portion, the clock circuit comprising:

a first node;

a first clock pulse generating circuit for generating a first clock pulse in response to the first edges of the external clock if said first node is at a first (normal) logic state, the first clock pulses having a first pulse edge and a second pulse edge, said first clock pulse generating circuit maintaining said first node at a second (lock-up) logic state in response to the first edges of the external clock if the first node is at the lock-up logic state;

a reset circuit for changing said first node to the normal logic state in response to the second pulse edge;

a sampling circuit for sampling said first node on the first clock edge of the external clock and holding the logic state for the remainder of the external clock cycle; and a lock-up correction circuit responsive to said sampling circuit for changing the logic state of the first pulse node to the normal logic state if the held logic state of the sampling circuit is the lock-up logic state, said lock-up correction circuit being disabled if the held logic state of the sampling circuit is the mormal logic state.

2. The clock circuit of claim 1 wherein:

the first clock pulse is generated at said first node;

said first clock pulse generating circuit includes
 a first pull up/down circuit for pulling said first pulse node to a first logic level for a first delay period in response to the first clock edge of the external clock, the logic transition being the first edge of the first clock pulse;
 a first latch coupled to said first node for latching the logic level thereof;
 and wherein said reset circuit includes a second pull up/down circuit for pulling said first node to a second logic level for a second delay period, the logic transition being the second edge of the first clock pulse.

3. The clock circuit of claim 2 wherein:

the first pull up/down circuit includes a first transistor and a second transistor of like conductivity type, the first transistor being coupled by its source to a first logic level and by its drain to the source of the second transistor, the drain of the second transistor being coupled to said first node, the gate of one of the transistors receiving the clock signal, the gate of the other transistor receiving the clock signal via an inverting delay element.

4. The clock circuit of claim 2 further including:

a second clock pulse generator coupled to said first node for generating a second clock pulse in response to a logic transition of said first node from the second logic level to the first logic level, the second clock pulse having an initial pulse edge and an end pulse edge.

5. The clock circuit of claim 4 wherein:

the second pull up/down circuit is coupled to said second clock pulse generator and pulls said first node to the second logic level in response to the end pulse edge of the second clock pulse.

6. The clock circuit of claim 5 wherein:

said second pull up/down circuit includes a first pulse generator for generating an input pulse in response to the second end pulse edge, and a supply gate for receiving the input pulse and pulling said first node to the second logic level for the duration of the input pulse.

7. The clock circuit of claim 4 wherein:

said second clock pulse generator includes adjustable delay means for adjusting the duration of the second pulse.

8. The clock circuit of claim 6 wherein:

said second clock pulse generator is two input NAND gate with one input having an inverting delay element.

9. The clock circuit of claim 2 wherein:

said sampling circuit includes
 a second latch for latching the logic level of said first node and providing a second latch output, the second latch output being a first lock-up signal when said first node is latched at the lock-up logic state, the second latch output being a first correction disable signal when said first node is latched at the normal logic state;
 a first clocked gate for coupling said first node to said second latch, said first clocked gate being closed during the first portion of the external clock and open during the second portion of the external clock;
 a third latch for latching the second latch output and providing a third latch output, the third latch output being a second lock-up signal when the second latch output is a first lock-up signal, the third latch output being a second correction disable signal when the second latch output is a first correction disable signal; and
 said lock-up correction circuit includes a means for pulling said first node to the normal logic state when the third latch output is the second lock-up signal and said external clock is in the second portion of the external clock, the means for pulling being disabled when the third latch output is the second correction disable signal.

10. The clock circuit of claim 9 wherein:

the means for pulling includes a first pull-up/down transistor and a second pull-up/down transistor, the first pull-up/down transistor having its source coupled to the second logic level and its drain coupled to the source of the second pull-up/down transistor, the second pull-up/down transistor having its drain coupled to said first node, the gate of one of the pull-up/down transistors receiving the third latch output, the gate of the other pull-up/down transistor receiving the external clock signal.

11. The clock circuit of claim 9 wherein:

the first clocked gate is a passgate of two complementary transistors, a first transistor of a first conductivity type and a second transistor of a second conductivity type; and the external clock being applied to the gates of the first transistor, the external clock being applied via an inverter to the second and third transistor.

12. The clock circuit of claim 1 wherein:

said clock pulse generator includes adjustable delay means for adjusting the duration of the first clock pulse.

13. The clock circuit of claim 1 further including:

a buffer for receiving a system clock and buffering the system clock to generate the external clock signal.

* * * * *